United States Patent [19]

Nakanishi et al.

[11] Patent Number: 5,212,403

[45] Date of Patent: May 18, 1993

[54] INTEGRATED CIRCUIT DEVICE HAVING AN IC CHIP MOUNTED ON THE WIRING SUBSTRATE AND HAVING SUITABLE MUTUAL CONNECTIONS BETWEEN INTERNAL CIRCUITS

[75] Inventors: Keiichirou Nakanishi, Kokubunji; Minoru Yamada, Hanno; Tatsuya Saitoh; Kazumichi Yamamoto, both of Kokubunji, all of Japan

[73] Assignee: Hitachi, Ltd., Tokyo, Japan

[21] Appl. No.: 755,652

[22] Filed: Sep. 6, 1991

[30] Foreign Application Priority Data

Sep. 10, 1990 [JP] Japan .................. 2-236958

[51] Int. Cl.⁵ ............... H01L 39/02; H01L 23/48; H01L 29/46
[52] U.S. Cl. ................... 257/664; 257/700; 257/724
[58] Field of Search ............ 357/80, 65, 71, 75; 361/417; 257/700

[56] References Cited

U.S. PATENT DOCUMENTS

| | | | | |
|---|---|---|---|---|
| 3,634,731 | 1/1972 | Skogmo | ............... | 257/539 |
| 4,551,746 | 11/1985 | Gilbert et al. | ............... | 357/74 |
| 5,021,869 | 6/1991 | Kaw | ............... | 257/700 |
| 5,055,907 | 10/1991 | Jacobs | ............... | 257/773 |

FOREIGN PATENT DOCUMENTS 0375869 7/1990 European Pat. Off. .
59-182540 10/1984 Japan .
8704009 7/1987 PCT Int'l Appl. .
2215121 9/1989 United Kingdom .

OTHER PUBLICATIONS

Patent Abstracts of Japan (JP-A-59-182540–Oct. 17, 1984), Abs. Pub. date–Feb. 22, 1985.
IBM Technical Disclosure Bulletin, vol. 28, No. 7, Dec. 1985, p. 2827.

Primary Examiner—Rolf Hille
Assistant Examiner—Robert Limanek
Attorney, Agent, or Firm—Antonelli, Terry, Stout & Kraus

[57] ABSTRACT

This invention discloses an integrated circuit device including an integrated circuit chip having logic circuits formed therein and a wiring substrate for mounting thereon the integrated circuit chip. The wiring substrate has signal wirings for connecting mutually input terminals and output terminals of the integrated circuit chip. The integrated circuit device includes signal wirings for effecting connections of the input terminals and output terminals of the same integrated circuit chip inside the wiring substrate. The logic circuits inside the same integrated circuit chip are mutually connected by signal wirings formed inside the integrated circuit chip when a wiring length is small, and are mutually connected by signal wirings formed inside the wiring substrate when the wiring length is great.

23 Claims, 2 Drawing Sheets

F I G. 2B
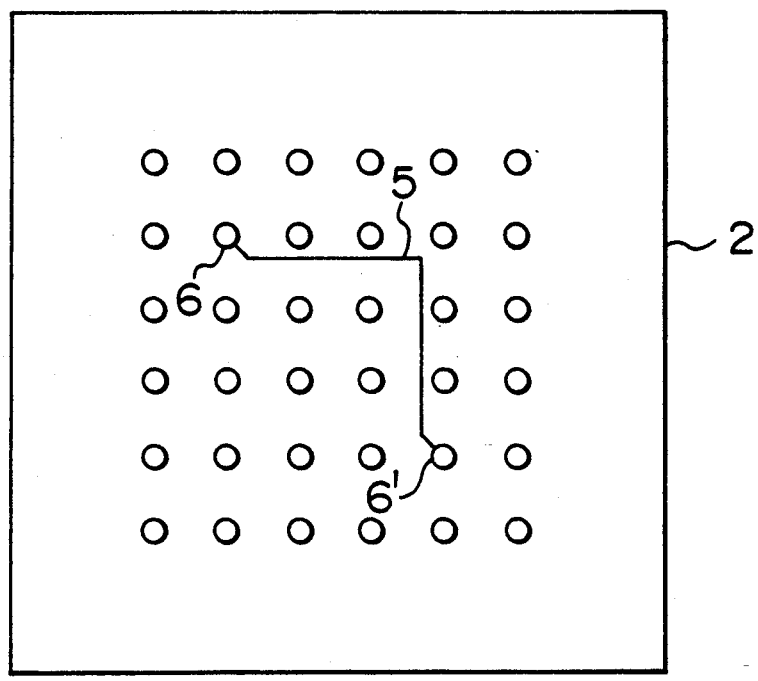
F I G. 3
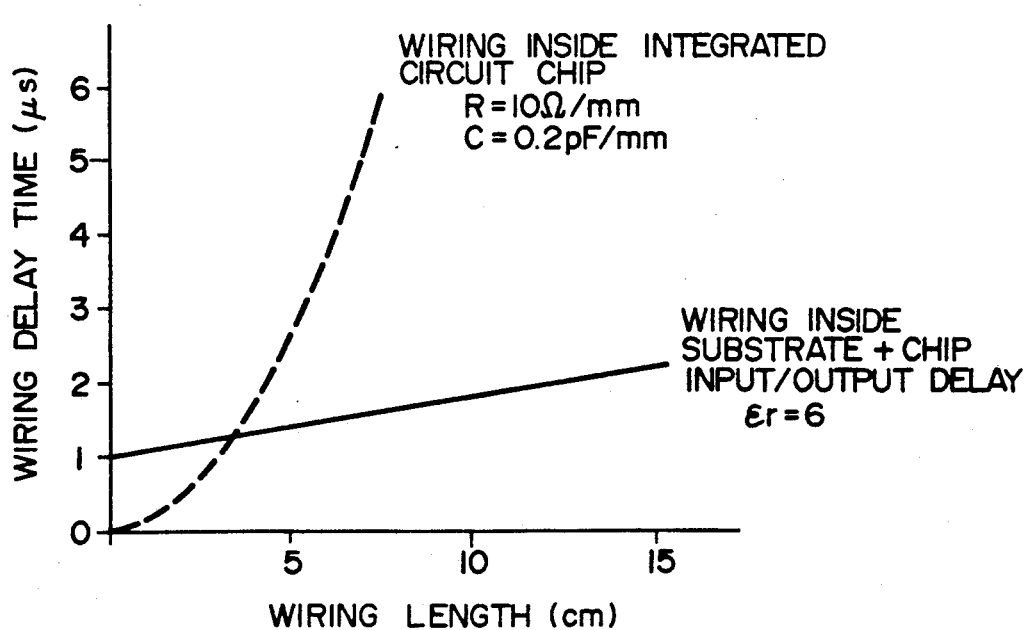

INTEGRATED CIRCUIT DEVICE HAVING AN IC CHIP MOUNTED ON THE WIRING SUBSTRATE AND HAVING SUITABLE MUTUAL CONNECTIONS BETWEEN INTERNAL CIRCUITS

BACKGROUND OF THE INVENTION

The present invention relates to an integrated circuit device for use in an electronic appliance such as a computer. More specifically, the present invention relates to an integrated circuit device which is suitable for accomplishing high velocity signal propagation between logic circuits inside an integrated circuit chip having a large chip size.

Signal transmission between logic circuits inside an integrated circuit chip is generally effected by signal wirings inside the integrated circuit chip using near-end termination. Regarding recent developments, the increase in the signal propagation delay time between the logic circuits inside the integrated circuit chip resulting from the miniaturization of the signal wirings and the increase in the wiring length inside the integrated circuit chip has become a serious problem as the degree of integration density and area of the integrated circuit chip have become increased. Besides a relatively high wiring resistance of the signal wiring inside the integrated circuit chip, this problem can be attributed significantly to the fact that the signal propagation delay time is in proportion to the square of the wiring length when near-end termination is employed as a driving system of the signal wiring.

To reduce the signal propagation delay time, far-end termination capable of higher velocity signal transmission than near-end termination may be employed, in principle. To effect signal transmission by far-end termination, however, the wiring resistance of the signal wiring must be sufficiently lowered. For this reason, far-end termination cannot be applied to driving of the signal wirings inside the integrated circuit chip having a relatively high wiring resistance.

JP-A-59-182540 discloses the technique which disposes signal wirings having a greater width than other wiring channels in partial regions of the wiring channels on the integrated circuit chip so as to reduce the wiring resistance of the signal wiring and to improve a signal transmission velocity. However, this technique is not free of the following problems.

(1) Since wide signal wirings exist in or are limited to a specific region, freedom is low when high velocity signal wirings must be used with respect to arbitrary gate circuits.

(2) Efficiency of use of the channels drops as a whole.

(3) Though the technique can reduce the wiring resistance of the signal wiring, it cannot reduce it to such an extent that far-end termination can be applied. Therefore, the problem that the signal propagation delay time is proportional to the square of the wiring length remains yet to be solved.

SUMMARY OF THE INVENTION

It is therefore an object of the present invention to provide an integrated circuit device which can effect signal transmission between logic circuits on an integrated circuit chip at a high velocity even in a large scale integrated circuit chip using fully one semiconductor wafer as one integrated circuit chip, for example.

The integrated circuit device in accordance with the present invention includes a wiring substrate having therein signal wirings for mutually connecting the input and output terminals of an integrated circuit chip, and the integrated circuit chip mounted onto this wiring substrate, wherein the wiring substrate has formed therein signal wirings for connecting the input and output terminals of the same integrated circuit chip. Mutual connection between the logic circuits inside the same integrated circuit chip is achieved by either the signal wiring inside the wiring substrate or the signal wirings inside the integrated circuit chip.

Preferably, that signal wiring having a smaller signal propagation delay time among the signal wiring inside the wiring substrate and the signal wiring inside the integrated circuit chip is used to mutually connect the logic circuits inside the integrated circuit chip.

A termination resistor is connected to the far-end side of the signal wiring inside the wiring substrate and far-end termination is applied as the driving system of the signal wiring.

The signal wiring inside the wiring substrate has a lower wiring resistance than the signal wiring inside the integrated circuit chip and can make long distance signal transmission at a high velocity.

Where logic circuits for signal transmission are disposed relatively near, the signal wiring inside the integrated circuit chip can make the transmission distance shorter and can make signal transmission at a higher velocity than the signal wiring inside the wiring substrate. Accordingly, signal transmission at a higher velocity can be achieved by the use of the wiring having shorter signal propagation delay time among the signal wiring inside the integrated circuit chip and the signal wiring inside the wiring substrate.

Furthermore, the wiring resistance of the signal wiring inside the wiring substrate can be reduced substantially. Therefore, signal transmission at a higher velocity can be attained by the use of far-end termination as the driving system of the signal wiring inside the wiring substrate.

BRIEF DESCRIPTION OF THE DRAWINGS

FIGS. 2A and 2B are plan views, each showing a wiring method between logic circuits inside an integrated circuit chip; and FIG. 3 is a diagram showing the relationship between a signal wiring inside an integrated circuit chip in the integrated circuit device in accordance with the present invention, the wiring length of a signal wiring inside a wiring substrate and a signal propagation delay time.

DESCRIPTION OF THE PREFERRED EMBODIMENT

Figure 1:
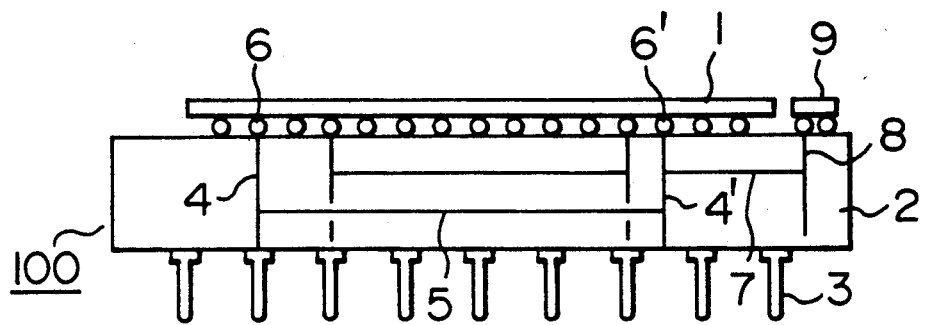
FIG. 1 is a longitudinal sectional view showing an integrated circuit device in accordance with one embodiment of the present invention.

FIG. 1 is a longitudinal sectional view showing an integrated circuit device in accordance with the present invention. The integrated circuit device 100 comprises an integrated circuit chip 1 of a wafer size, for example, which is fabricated using one semiconductor wafer, and a wiring substrate 2. Various logic circuits are formed inside the integrated circuit chip 1. The integrated circuit chip 1 is connected to the wiring substrate 2 by solder bump terminals 6, 6', etc, and the logic circuits inside the integrated circuit chip 1 can be mutually connected inside the wiring substrate 2 through a through-hole 4, a signal wiring 5 inside the wiring substrate and a through-hole 4'. This signal wiring 5 is connected to a termination resistor 9 on a far-end side through the wiring 7 and the through-hole 8, so that signal transmission by a far-end termination system becomes possible.

Input/output pins 3 for signal connection between the integrated circuit device 100 and an external device (not shown) and for the supply for a power source voltage to the integrated circuit device are brazed to the back (or rear face) of the wiring substrate 2. It is possible to use a ceramic as the material of the wiring substrate 2 and a cover, as the material of the input/output pins 3, for example.

Figure 2A:
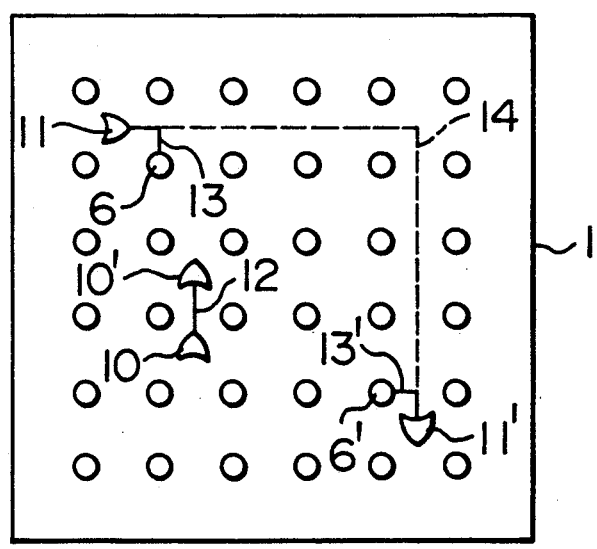

FIG. 2 is a plan view which shows a wiring method inside the integrated circuit chip and on the wiring substrate in the embodiment described above. FIG. 2A shows the signal wirings inside the integrated circuit chip 1 and FIG. 2B shows the signal wirings for connecting the logic circuits with one another inside the wiring substrate through the solder bump terminals 6, 6'.

In FIG. 2A, reference numerals 10, 10', 11 and 11' represent the logic circuits inside the integrated circuit chip 1. Reference numerals 12, 13 and 13' represent the signal wirings of aluminum wirings, or the like, which are formed inside the integrated circuit chip 1 by the application of the present invention. Reference numeral 14 represents the signal wiring for connecting the logic circuits 11 and 11' without using the present invention.

The logic circuits 10, 10' inside the integrated circuit chip 1 are disposed adjacent to each other and are connected mutually by the signal wiring 12 such as the aluminum wiring inside the integrated circuit chip. Signal transmission between the logic circuits 10 and 10' is made by the signal wiring 12. A termination resistor is connected to the signal wiring 12 on its near-end side in the same way as in the connection method in accordance with the conventional near-end termination system. The termination resistor is formed as part of the logic circuit 10 on the nearend side inside the wafer by the use of a resistance made by diffusion process, though not shown in drawings.

In contrast, the logic circuits 11 and 11' are disposed in the spaced-apart relation with each other. The output of the logic circuit 11 is connected to the solder bump terminal 6 by the aluminum wiring 13 and is once taken outside the integrated circuit chip 1. It is then connected to the signal wiring 5 inside the wiring substrate 2 through the solder bump terminal 6 and the through-hole 4 as shown in FIGS. 1 and 2B. Similarly, the input of the logic circuit 11' is connected to the solder bump terminal 6' by the aluminum wiring 13' and then to the signal wiring 5 inside the wiring substrate 2 through the solder bump terminal 6' and the through-hole 4'. In this manner, signal transmission between the logic circuits 11 and 11' can be made by the signal wiring 5 inside the wiring substrate 2. The far-end side of the signal wiring 5 is connected to the termination resistor 9 on the wiring substrate 2 through the wiring 7 and the through-hole 8 as shown in FIG. 1, and is driven by the far-end termination system. Unlike the logic circuit 10, therefore, the termination resistor is not formed on the logic circuit 11 side.

By the way, the amplitude of the output signal of the logic circuit 11 is so small that the signal wiring 5 inside the wiring substrate 2 cannot directly be driven. For this reason, a buffer for driving the signal wiring inside the substrate is practically connected between the logic circuit 11 and the solder bump terminal 6, though it is not shown in the drawings.

As described above, when the connection between the logic circuits 11 and 11', which are disposed in the mutually spaced-apart relation, is made by the use of the signal line 5 inside the wiring substrate 2, the signal propagation time can be shortened much more than in the connection using the signal wiring 14 inside the integrated circuit chip 1.

Next, the signal propagation delay time of the wiring portion in the near-end termination system and in the far-end termination system will be explained. For example, the far-end voltage waveform when a signal of a predetermined voltage is applied to the near-end of a transmission line and the far-end is opened is compared with the far-end current waveform when the far-end is short-circuited. It is known in this case that in comparison with the rise time of the far-end voltage waveform when the far-end is released, the rise time of the far-end current waveform when the far-end is short-circuited is smaller by 3 to 10 times.

The conventional near-end termination system corresponds to the case where the far-end is released in the example described above, and can be said to be the most disadvantageous system as to the rise time of the signal waveform at the far-end. In contrast, the far-end termination system can accomplish the rise time between the rise time when the far-end is released in the example described above and the rise time when the far-end is short-circuited. The factor that determines the rise time is the termination resistor value at the far-end, and the smaller the resistor value, the smaller becomes the rise time. It could be therefore understood that the far-end termination system can make signal transmission at a higher velocity than the near-end termination system.

The signal wiring 5 inside the wiring substrate 2 is not so thin as the signal wiring 12 inside the integrated circuit chip 1, and a metal having low resitivity such as Cu can be used as the wiring material. For this reason, the wiring resistance of the signal wiring 5 can be incomparably reduced than the wiring resistance of the signal wiring 12 inside the integrated circuit chip 1. To make far-end termination, the wiring resistance must be sufficiently low (below 0.5 $\Omega$/cm) and in this point, the signal wiring 5 inside the wiring substrate 1 is advantageous.

In contrast, the signal wiring inside the integrated circuit chip 1 has a wiring resistance of as large as about 10 $\Omega$/mm, and is therefore not suitable for the far-end termination system. Therefore, the near-end termination system is applied to the signal wiring inside the integrated circuit chip 1 because it can transmit the signals without lowering the amplitude even by a wiring having a large wiring resistance, although it has a large signal propagation delay time.

In the present invention, too, the near-end termination system is applied to the signal wiring 12 inside the integrated circuit chip 1. However, since the signal wiring 12 inside the integrated circuit chip 1 in the present invention is used for short-range signal transmission, it has a short wiring length and the signal propagation delay time does not become a critical problem.

Next, an example of the design flow, which is employed for determining which of the signal wiring among the signal wiring 12 inside the integrated circuit chip 1 and the signal wiring 5 inside the wiring substrate 2 should be applied to the signal wiring for mutually connecting the logic circuits in the integrated circuit device in accordance with the present invention, will be illustrated. To begin with, a system is designed by the signal wiring inside the integrated circuit chip 1 in the same way as in the conventional integrated circuit device. Next, the signal propagation delay time between arbitrary gates is checked by simulation. This simulation can be carried out by a delay check system which is known in the art as a design tool of a large scale computer available at present. The signal wiring which generates a delay exceeding a certain predetermined value is changed to the signal wiring of the far-end termination system through the signal wiring 5 inside the wiring substrate 2 in accordance with the results of simulation. The system designed in this manner is again checked by the delay check system and its effect is confirmed.

Besides the checking procedure using the simulation from the beginning as described above, higher design efficiency can be obtained by using the signal wiring 5 inside the wiring substrate 2 from the start for those signal wirings inside the integrated circuit chip 1 which have a large wiring length and can therefore be judged in advance as unsuitable for the signal wiring 5.

FIG. 3 shows the relationship between the signal wiring inside the integrated circuit chip, the wiring length of the signal wiring inside the wiring substrate and the signal propagation delay time in the integrated circuit device in accordance with the present invention.

The wiring length between the logic circuits which are to be mutually connected are plotted on the abscissa of the diagram in FIG. 3 and the delay time required for the signal to propagate between the logic circuits is plotted on the ordinate. Dash line represents the case where the signal wiring inside the integrated circuit chip in accordance with the near-end termination system is used and solid line does the case where the signal wiring inside the wiring substrate in accordance with the far-end termination system is used. In FIG. 3, circuit constants of the signal wiring inside the integrated circuit chip include the wiring resistance R=10 Ω/mm and the wiring capacitance C=0.2 pF/mm, by way of example. The dielectric constant of the wiring substrate is $\epsilon_r = 6$.

Here, the signal propagation delay time $t_1$ of the signal wiring inside the integrated circuit chip can be expressed by the following equation:

$$t_1 = ACl + BCRl^2$$

The signal propagation delay time $t_2$ of the signal wiring inside the wiring substrate can be expressed by the following equation:

$$t_2 = \text{chip input/output delay} + D\sqrt{\epsilon_r}\, l$$

where A, B and D are constants depending on the design of the integrated circuit chip and packaging system. It can be understood from the diagram shown in FIG. 3 that the signal wiring inside the integrated circuit chip and the signal wiring inside the wiring substrate may be used appropriately with the wiring length of about 3 cm being the boundary, for example.

As already described, the wiring delay time increases in proportion to the square of the wiring length of the signal wiring in the signal transmission of the near-end termination system using the wiring inside the integrated circuit chip. Therefore, when the wiring length of the signal wiring exceeds 5 cm, the wiring delay time increases drastically and a high signal propagation velocity cannot be expected any more. In contrast, in accordance with the far-end termination signal transmission system using the wiring inside the wiring substrate, the wiring delay time is proportional to the wiring length of the signal wiring; hence, the increase in the wiring delay time is not very great as the wiring length increases. Even when the wiring length is as great as about 15 cm, for example, the signal propagation delay time still remains at a relatively small level of about 2 ns, as can be appreciated from the diagram.

If the wiring inside the wiring substrate is used, the wiring substrate cannot be directly driven by the signal having a low amplitude inside the integrated circuit chip, and a buffer circuit for driving the wiring inside the substrate is required. In the diagram shown in FIG. 3, the signal propagation delay time when the signal wiring inside the wiring substrate in accordance with the far-end termination system is used is depicted while it includes about 1 ns of the delay time due to the delay time of this buffer circuit and to the increase in the delay time by the solder bump terminals. Even when the increase in the signal propagation delay time due to the propagation delay in such a buffer circuit is taken into consideration, the present invention would maintain its superiority to the conventional integrated circuit device.

The integrated circuit device in the embodiment given above has been explained about the integrated circuit chip of a wafer size by way of example, but the present invention is in no way limited thereto but can of course be applied to those integrated circuit devices which include an integrated circuit chip in which the wiring length of the signal wiring becomes large and the signal propagation delay time becomes a problem.

In accordance with the present invention, the signal wiring inside the integrated circuit chip and the signal wiring inside the wiring substrate are used appropriately for the signal transmission between the logic circuits inside the integrated circuit chip. Accordingly, the present invention provide signal transmission without increasing the signal propagation delay time. Where the signal transmission distance becomes great, the present invention uses the signal wiring inside the wiring substrate. For this reason, it is not necessary to increase the width of the signal wiring in order to reduce the wiring resistance of the signal wiring inside the integrated circuit chip, and a higher integration density of the integrated circuit chip can therefore be accomplished. In other words, the present invention can accomplish a higher density and higher velocity integrated circuit device than the conventional semiconductor circuit devices.

We claim:

1. An integrated circuit device comprising:
   an integrated circuit chip having a plurality of logic circuits formed therein;
   first signal wirings disposed inside said integrated circuit chip;
   output terminals for providing output signals of said logic circuits from said integrated circuit chip;
   input terminals for receiving input signals to be applied to said logic circuits in said integrated circuit chip;
   a wiring substrate for mounting thereon said integrated circuit chip; and second signal wirings disposed in said wiring substrate, for connecting electrically said output terminals to said input terminals, wherein said transmission between respective ones of said logic circuits, inside said integrated circuit chip, is provided through a wiring taken from either said first signal wirings or said second signal wirings.

2. An integrated circuit device according to claim 1, which further comprises:

first termination resistors which are connected to the near-end side of respective ones of said first signal wirings used for providing electrical connections between respective ones of said logic circuits; and second termination resistors which are connected to the far-end side of respective ones of said second signal wirings used for providing electrical connections between respective ones of said logic circuits.

3. An integrated circuit device according to claim 2, wherein the wiring length for effecting electrical connections between respective ones of said logic circuits by said first signal wirings is limited to 5 cm.

4. An integrated circuit device according to claim 3, wherein said second signal wirings are of a greater wiring length than said first signal wiring.

5. An integrated circuit device according to claim 2, wherein said first termination resistors are formed by use of resistance made by a diffusion process.

6. An integrated circuit device according to claim 1, wherein said integrated circuit ship has a size substantially equal to the size of a semiconductor wafer.

7. A connection method of logic circuits in an integrated circuit device including an integrated circuit chip having a plurality of logic circuits formed therein and a wiring substrate for mounting thereon said integrated circuit chip, comprising the steps of:

connecting mutually respective ones of said logic circuits for effecting signal transmission between them by first signal wirings which are disposed inside said integrated circuit chip when the corresponding wiring lengths thereof do not exceed a predetermined wiring length; and connecting mutually respective ones of said logic circuits for effecting signal transmission between them by second signal wirings which are disposed inside said wiring substrate when the corresponding wiring lengths thereof exceed said predetermined wiring length.

8. A connection method of connecting mutually logic circuits in an integrated circuit device according to claim 7, wherein the connection using said second signal wirings is made by connecting the outputs of said logic circuits to said second signal wirings through output terminals of said integrated circuit chip and through through-holes inside said wiring substrate and connecting the inputs of said logic circuits to said second signal wirings through input terminals of said integrated circuit chip and through through-holes inside said wiring substrate.

9. A connection method of connecting mutually logic circuits in an integrated circuit device according to claim 7, wherein said predetermined wiring length is such that the delay time of signal transmission by said first signal wirings is substantially equal to the delay time of signal transmission by said second signal wirings.

10. An integrated circuit device according to claim 2, wherein said first termination resistors are formed by use of resistance made by a diffusion process.

11. An integrated circuit device according to claim 4, wherein said integrated circuit chip has a size substantially equal to the size of a semiconductor wafer.

12. An integrated circuit device according to claim 11, wherein said first signal wirings have a substantially greater resistance per unit length than that of said second signal wirings.

13. An integrated circuit device according to claim 12, wherein said first signal wirings are comprised of aluminum and said second wirings are comprised of copper.

14. An integrated circuit device according to claim 13, wherein said second signal wirings are formed inside said wiring substrate as a multi-level wiring arrangement in which respective connections thereof to input terminals and output terminals of respectively different ones of said logic circuits are made through through-holes inside said wiring substrate.

15. An integrated circuit device according to claim 1, wherein said first signal wirings has a substantially greater resistance per unit length than that of said second signal wirings.

16. An integrated circuit device according to claim 16, wherein said first signal wirings are comprised of aluminum and said second wirings are comprised of copper.

17. An integrated circuit device according to claim 16, wherein said second signal wirings are formed inside said wiring substrate as a multi-level wiring arrangement in which respective connections thereof to input terminals and output terminals of respectively different ones of said logic circuits are made through through-holes inside said wiring substrate.

18. An integrated circuit device according to claim 1, wherein said second signal wirings are formed inside said wiring substrate as a multi-level wiring arrangement in which respective connections thereof to input terminals and output terminals of respectively different ones of said logic circuits are made through through-holes inside said wiring substrate.

19. A connecting method of connecting mutually logic circuits in an integrated circuit device according to claim 8, wherein said predetermined wiring length is such that the delay time of signal transmission by said first signal wirings is substantially equal to the delay time of signal transmission by said second signal wirings.

20. An integrated circuit device according to claim 19, wherein said first signal wirings have a substantially greater resistance per unit length than that of said second signal wirings.

21. An integrated circuit device according to claim 20, wherein said first signal wirings are comprised of aluminum and said second wirings are comprised of copper.

22. An integrated circuit device according to claim 8, which further comprises:

first termination resistors which are connected to the near-end side of respective ones of said first signal wirings used for providing electrical connections between respective ones of said logic circuits; and second termination resistors which are connected to the far-end side or respective ones of said second signal wirings used for providing electrical connections between respective ones of said logic circuits.

23. An integrated circuit device according to claim 8, wherein said integrated circuit chip has a size substantially equal to the size of a semiconductor wafer.

* * * * *